United States Patent [19]

Liu

[11] Patent Number: 5,300,803
[45] Date of Patent: Apr. 5, 1994

[54] SOURCE SIDE INJECTION NON-VOLATILE MEMORY CELL

[75] Inventor: David K. Liu, Sunnyvale, Calif.

[73] Assignee: Texas Instruments Incorporated, Dallas, Tex.

[21] Appl. No.: 992,858

[22] Filed: Dec. 14, 1992

[51] Int. Cl.$^5$ .................. H01L 29/68; H01L 29/78
[52] U.S. Cl. .................... 257/322; 257/316; 257/900
[58] Field of Search ............... 257/322, 316, 315, 900

[56] References Cited

U.S. PATENT DOCUMENTS

| | | | |
|---|---|---|---|
| 4,652,897 | 7/1985 | Okuyama et al. | 257/322 |
| 4,972,371 | 11/1990 | Komori et al. | 257/322 |
| 5,032,881 | 7/1991 | Sardo et al. | 257/316 |

FOREIGN PATENT DOCUMENTS

| | | | |
|---|---|---|---|
| 54-33636 | 12/1979 | Japan | 257/316 |
| 57-18369 | 1/1982 | Japan | 257/316 |
| 62-71277 | 4/1987 | Japan | 257/316 |

Primary Examiner—Rolf Hille
Assistant Examiner—Robert Limanek
Attorney, Agent, or Firm—John D. Crane; Stanton C. Braden; Richard L. Donaldson

[57] ABSTRACT

A source side injection non-volatile memory cell is provided that comprises a floating gate and control gate stack (12) disposed outwardly from a channel region (26) formed on an (n−)-substrate (10). Drain region (32) and source region (30) are formed on opposite sides of stack structure (12). Source side injection of hot electrons occurs between source region (30) and floating gate (18) when relatively low voltages are placed on gate conductor (22).

12 Claims, 2 Drawing Sheets

SOURCE SIDE INJECTION NON-VOLATILE MEMORY CELL

TECHNICAL FIELD OF THE INVENTION

The present invention relates in general to electronic devices and more particularly to an improved non-volatile memory cell and method for forming the cell.

BACKGROUND OF THE INVENTION

Electrically programmable read-only memories (EPROMs) and electrically programmable electrically erasable read-only memories (EEPROMs) are non-volatile semiconductor memory devices based on metal oxide semiconductor field effect transistors (MOSFETs). EPROM and EEPROM cells store a bit of information as a quantity of electrons on a floating gate structure which is insulatively disposed between the channel and the control gate of a field effect transistor. A charged floating gate raises the threshold voltage of the field effect transistor channel above the voltage normally applied to the control gate during the read operation such that the transistor remains shut off when read voltages are applied to the gate, source and the drain, thereby returning a logical "0". An uncharged floating gate does not alter the threshold voltage of the channel of the field effect transistor, and therefore a normal gate reading voltage will exceed the threshold voltage, turning on the transistor when read voltages are applied to the gate, source and the drain. In this condition, a logical "1" is returned.

When EPROM or EEPROM cells use a conventional floating gate avalanche injection metal oxide semiconductor (FAMOS) structure, the floating gate is charged by avalanche injection, commonly referred to as "hot electron injection". Prior structures have allowed for source side injection where a majority of the electrons injected to the floating gate come from the source side of the cell. In these structures, a much more significant gate current can be realized since the electric field across the gate oxide near the source, as created by the voltage difference between the grounded source and the control gate is at a maximum. One such source side injection cell is disclosed in an "Asymmetrical Non-volatile Memory Cell, Arrays and Methods for Fabricating Same," filed by Liu et al. on Aug. 29, 1990, application Ser. No. 07/575,105 assigned to the assignee of the present application, now abandoned, the disclosure of which is hereby incorporated by reference. The structure disclosed in the previously cited application shows significantly enhanced gate current due to the high efficiency of source side injection. The structure allows for fast programming speed at 5 volts on the drain due to the enhanced injection efficiency. Furthermore, the structure has the potential of being programmed at 3.3 volts on the drain, thus allowing the operation of this structure with scaled power supplies. However, the structure disclosed in the previously cited application requires a relatively high gate voltage to enable fast programming.

Accordingly, a need has arisen for non-volatile memory cell which allows for fast programming through the operation of source side hot electron injection at lower gate voltages.

SUMMARY OF THE INVENTION

In accordance with the teachings of the present invention, a non-volatile memory cell is provided that substantially eliminates or reduces disadvantages and problems associated with prior cell architectures.

According to one embodiment of the present invention, a memory cell is provided that is formed on a substrate of a predetermined conductivity type. A control gate and floating gate stack is formed on a surface of the substrate. A diffused region having a conductivity type opposite the predetermined conductivity type is formed in the surface of the substrate such that a portion of the diffused region is disposed inwardly from the control gate and floating gate stack. The portion of the diffused region proximate the control gate and floating gate stack forms a channel region of the cell. Highly doped contact regions of the predetermined conductivity type are then formed on opposite sides of the floating gate and control gate stack. An important technical advantage of the present invention inheres in the fact that the channel length of the cell of the present invention is defined by the lateral diffusion of an implanted region and therefore can be precisely controlled and can be sized below the limit that can be defined by lithographic methods.

An additional technical advantage of the present invention inheres in the fact that the reduced channel length provides for low channel resistance. Accordingly, source side injection will occur at lower gate voltages.

BRIEF DESCRIPTION OF THE DRAWINGS

A more complete understanding of the present invention may be acquired by referring to the accompanying drawings wherein like reference numbers indicate like features and wherein.

DETAILED DESCRIPTION OF THE INVENTION

Figure 1A:
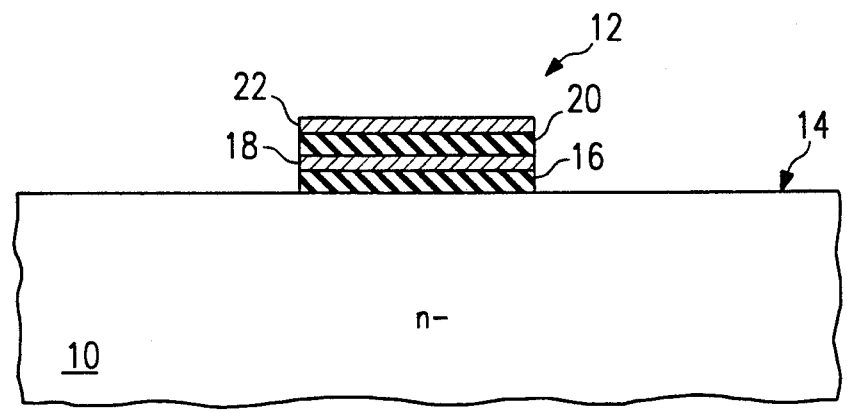
FIGS. 1a–1c are cross-sectional schematic illustrations of the non-volatile memory cell and method for fabricating the same constructed according to the teachings of the present invention.

Referring to FIG. 1a, the memory cell of the present invention is constructed on a portion of a substrate 10 which has been doped to be, for example, (n−)-type. Substrate 10 is doped using an implant of, for example, phosphorous to a concentration on the order of $10^{15}$ ions per square centimeter.

It should be understood that substrate 10 may comprise the actual semiconductor material of a wafer or it may comprise a different region within an integrated device. For example, the memory cell of the present invention may be formed in an n-type substrate or, alternatively, in an n-well formed in a p-type substrate.

A floating gate and control gate stack indicated generally at 12 is formed on an outer surface 14 of substrate 10 by first growing a gate oxide layer 16 to a depth on the order of 100–200 angstroms. For purposes of brevity, the entirety of the layers used to form stack 12 are not shown. It should be understood that the layers used to form stack 12 are successively formed and the entire conglomeration of layers is patterned and etched to form stack 12 using conventional photolithographic graphic and etching processes.

After the formation of gate oxide layer 16, a layer of polycrystalline silicon is deposited to a depth of on the order of 3,000–4,000 angstroms and is doped with sufficient impurities so as to render it conductive. This layer of polycrystalline silicon is patterned to form a floating gate 18 shown in FIG. 1a. An interlevel insulator layer 20 is deposited outwardly from floating gate layer 18. Interlevel insulator layer 20 may comprise a layer of oxide deposited or grown to a depth on the order of 150–500 angstroms. Finally, a second conductive layer of polycrystalline silicon 22 is deposited outwardly from interlevel insulator layer 20. Layer 22 is deposited to a depth on the order of 3,000–4,500 angstroms and is doped with sufficient impurities so as to render it conductive. The conglomeration of layers is etched using conventional anisotropic stack etching processes to form stack 12 shown in FIG. 1a. It should be understood that for convenience of teaching the present invention, FIG. 1a is not drawn to scale with respect to the relative dimensions of the layers forming stack 12.

Figure 1B:
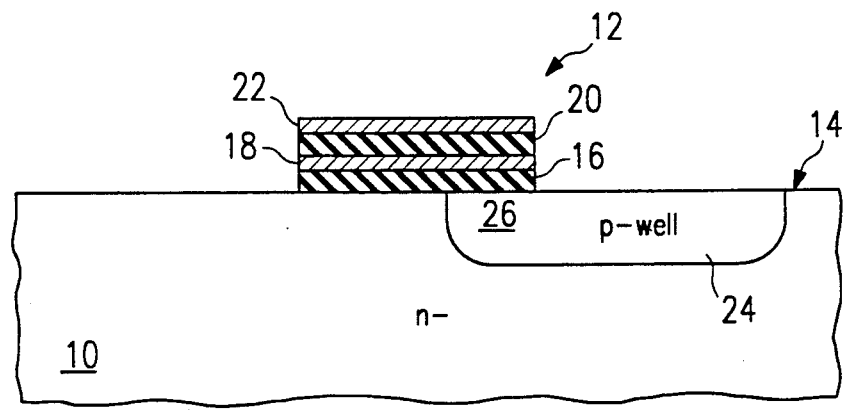

Referring to FIG. 1b, a p-well 24 is formed in substrate 10 by implanting, for example, boron atoms through surface 14. P-well 24 is first formed using a self-aligned implant process with respect to the edge of stack 12. P-well 24 comprises on the order of $10^{17}$ ions per square centimeter. The entire structure is then annealed to allow the boron impurities to diffuse laterally under stack 12 to define a channel region 26 as shown in FIG. 1b. The diffusion of impurities can be very closely controlled by controlling the temperature and time of the annealing process. As such, the length of channel region 26 corresponding to the distance the impurities diffuse under stack 12 is a parameter that can be very accurately controlled. The length of channel region 26 is on the order of one-half to one-third of the length of the entire stack 12. This greatly reduces the resistance of the channel region 26 when the device is turned on. In addition, the length of channel region 26 can be accurately sized using the methods described to dimensions much smaller than those possible using conventional photolithographic methods and systems.

Figure 1C:
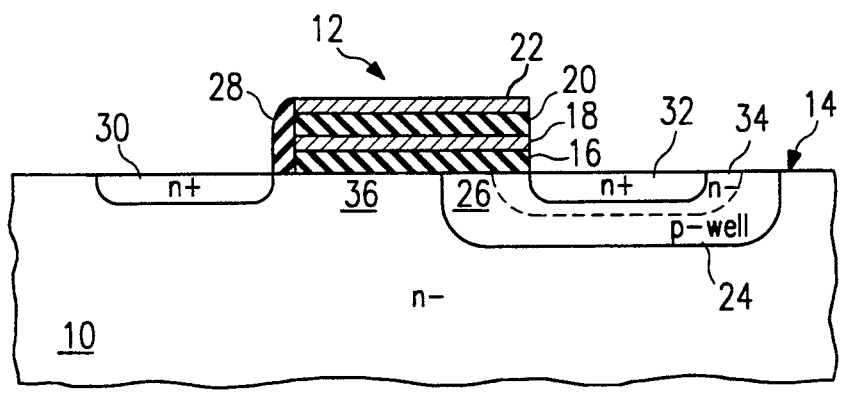

Referring to FIG. 1c, a sidewall insulator body 28 is formed on the side of stack structure 12 opposite p-well 24 and channel region 26. Sidewall insulator body 28 is formed by using conventional photolithographic deposition and etching processes.

N-type impurities such as, for example, arsenic are then implanted through surface 14 to form source region 30 and drain region 32. Source region 30 is self-aligned to the edge of sidewall insulator body 28. Drain region 32 is self-aligned to the edge of stack structure 12 opposite sidewall insulator body 28. Regions 30 and 32 comprise on the order of $10^{20}$ ions per square centimeter. According to one embodiment of the present invention, sidewall insulator body 28 is omitted and source region 30 is formed such that it is self-aligned to the edge of stack 12.

According to a further alternate embodiment of the present invention, an intermediate implant procedure is used to form (n−)-region 34 delineated by dashed lines in FIG. 1c. (N−)-region 34 may be formed by implanting phosphorous to a concentration of $10^{15}$ ions per square centimeter. In addition, region 34 may comprise a variety of graded implant schemes using conventional techniques. (N−)-region 34 serves to lower the electric field associated with the interface of channel region 26 with drain region 32.

In operation, source side injection of hot electrons onto floating gate structure 18 will occur when the resistance across the channel region 26 falls below the resistance across the portion of the (n−)-substrate between channel region 26 and source region 30. Due to the reduced channel length, the resistance across channel region 26 is smaller than the resistance across the (n−)-substrate in the portion of the (n−)-substrate indicated at 36 in FIG. 1c for relatively low gate voltages. Accordingly, source side injection of hot electrons from the source region 30 onto the floating gate 18 is accomplished with low voltages placed on gate conductor 22. The erase operation can be accomplished through the substrate 10 beneath channel region 26 using known methods.

Figure 2:
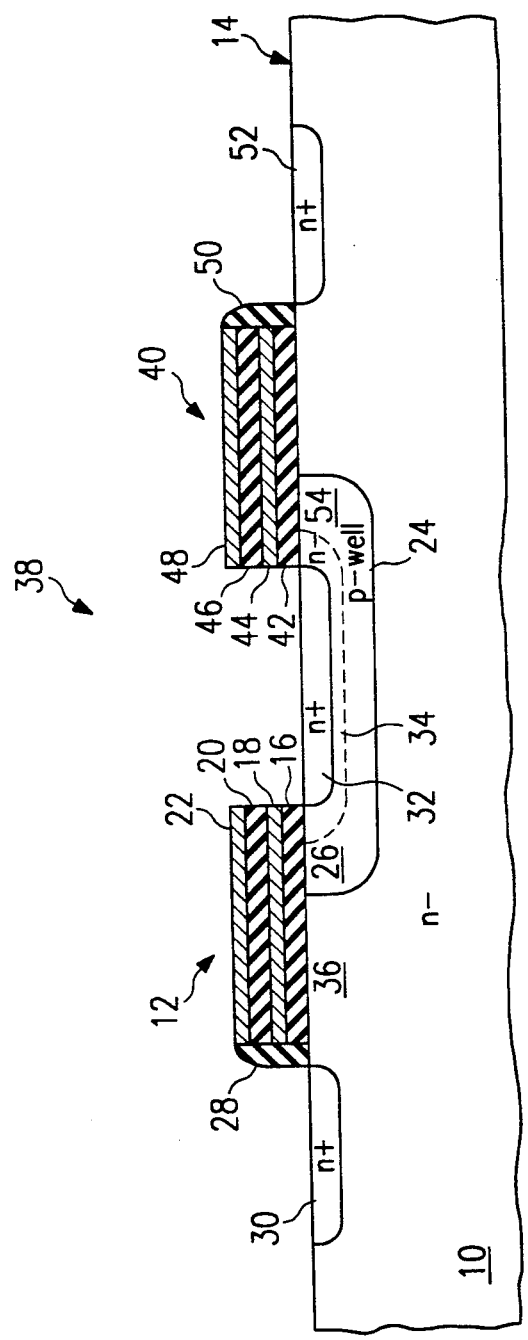
FIG. 2 is a cross-sectional schematic illustration of an array of memory cells constructed according to the teachings of the present invention.

FIG. 2 is a schematic illustration of an array 38 which comprises control stack 12 and a second control stack 40 which is constructed using the same steps used to construct control stack 12. Control stack 40 comprises a gate insulator 42 which is constructed simultaneously with the construction of gate insulator 16 discussed previously. Similarly, control stack 40 comprises a floating gate 44, an interlevel insulator 46 and a control gate 48 which are constructed simultaneously with floating gate 18, interlevel insulator 20 and control gate 22, respectively. A sidewall insulator 50 is disposed proximate control stack 40 as shown in FIG. 2. Sidewall insulator 50 is formed simultaneously with the formation of sidewall insulator 28. A source region 52 is formed to be self-aligned with sidewall insulator body 50 as shown in FIG. 2. Source region 52 is formed simultaneously with source region 30.

Drain region 32 is self-aligned to the edge of control stack 12 and to the edge of control stack 40 as shown in FIG. 2. (N−)-region 34 and (p)-well region 24 extend under control stack 40 to define a second channel region 54 as shown in FIG. 2. Channel region 54 enjoys the same benefits and operates in the same manner as channel region 26.

Accordingly, asymmetrical non-volatile memory cells may be formed in arrays such that adjacent cells share common drains such as drain region 32 shown in FIG. 2. In this manner, memory cell arrays can be constructed having high device densities. Additionally, the devices enjoy the technical advantages and operational characteristics described previously.

Although the present invention has been described in detail, it should be understood that various changes, alterations and substitutions may be made herein without departing from the spirit and scope of the present invention as solely defined by the appended claims. For example, although the present invention has been described using an (n−)-substrate 14 and a p-well 24 to define the channel region 26, conventional methods may be used to form an n-channel device comprising a (p−)-substrate and an n-well to form a channel region.

What is claimed is:

1. A memory cell formed on an outer surface of a semiconductor layer of a predetermined conductivity type, comprising:

a floating gate insulatively disposed adjacent the surface;

a control gate insulatively disposed adjacent said floating gate, said floating gate disposed between the surface and said control gate such that said floating gate and control gate form a control stack insulatively disposed on the surface;

a source region disposed in the layer proximate a first edge of said control stack, said source region comprising a conductivity type the same as said predetermined conductivity type;

a well region formed in said semiconductor layer partially underlying said control stack, said well region comprising a conductivity type opposite said predetrmined conductivity type; and a drain region disposed in said well region proximate a second edge of said control stack, said drain region comprising a conductivity type the same as said predetermined conductivity type.

2. The memory cell of claim 1 wherein said control stack further comprises:

a gate insulator disposed between the surface and said floating gate; and an interlevel insulator disposed between said floating gate and said control gate.

3. The memory cell of claim 1 and further comprising:

a sidewall spacer body disposed adjacent said first edge of said control stack, said source region disposed in the layer adjacent said sidewall insulator body.

4. The memory cell of claim 1 and further comprising:

a diffused region of said predetermined conductivity type disposed between said drain region and said channel region, said diffused region comprising a lower concentration of impurities than the concentration of impurities associated with said drain region.

5. The memory cell of claim 1 wherein said substrate comprises silicon, said predetermined conductivity type comprises n-type conductivity and said opposite conductivity type comprises p-type conductivity.

6. The memory cell of claim 1 wherein said substrate comprises silicon, said predetermined conductivity type comprises p-type conductivity and said opposite conductivity type comprises n-type conductivity.

7. The memory cell of claim 1 wherein said channel region comprises a portion of a well region disposed proximate the surface and the second edge of said control stack.

8. A memory cell formed on an outer surface of a silicon layer of a predetermined conductivity type comprising:

a floating gate;

a control gate;

an insulator disposed between said floating gate and the surface and an interlevel insulator disposed between said floating gate and said control gate, said floating gate and said control gate forming a control stack insulatively disposed on the surface;

a source region disposed in the layer proximate a first edge of said control stack;

a channel well disposed in the layer proximate a second edge of said control stack and extending partially under said control stack, said well comprising a conductivity type opposite said predetermined conductivity type; and a drain region disposed in said well proximate the second edge of said control stack, said drain having the same conductivity type as said predetermined conductivity type.

9. The memory cell of claim 8 and further comprising:

a sidewall spacer body disposed adjacent said first edge of said control stack, said source region disposed in the layer adjacent said sidewall insulator body.

10. The memory cell of claim 8 and further comprising:

a diffused region of said predetermined conductivity type disposed between said drain region and said channel region, said diffused region comprising a lower concentration of impurities than the concentration of impurities associated with said drain region.

11. The memory cell of claim 8 wherein said substrate comprises silicon, said predetermined conductivity type comprises n-type conductivity and said opposite conductivity type comprises p-type conductivity.

12. The memory cell of claim 8 wherein said substrate comprises silicon, said predetermined conductivity type comprises n-type conductivity and said opposite conductivity type comprises p-type conductivity.

* * * * *